United States Patent
Noda et al.

(10) Patent No.: US 10,459,036 B2
(45) Date of Patent: Oct. 29, 2019

(54) BATTERY CHECKER

(71) Applicant: NTN CORPORATION, Osaka (JP)

(72) Inventors: Hiroyuki Noda, Kuwana (JP);
Masatoshi Mizutani, Kuwana (JP);
Natsuhiko Mori, Kuwana (JP)

(73) Assignee: NTN CORPORATION, Osaka (JP)

( * ) Notice: Subject to any disclaimer, the term of this patent is extended or adjusted under 35 U.S.C. 154(b) by 261 days.

(21) Appl. No.: 15/454,494

(22) Filed: Mar. 9, 2017

(65) Prior Publication Data

US 2017/0184677 A1    Jun. 29, 2017

Related U.S. Application Data

(63) Continuation of application No. PCT/JP2015/074666, filed on Aug. 31, 2015.

(30) Foreign Application Priority Data

Sep. 12, 2014 (JP) .................. 2014-186347

(51) Int. Cl.
*G01R 31/3835* (2019.01)
*G01R 31/36* (2019.01)
(Continued)

(52) U.S. Cl.
CPC ......... *G01R 31/3835* (2019.01); *G01R 31/36* (2013.01); *H01M 10/4285* (2013.01);
(Continued)

(58) Field of Classification Search
CPC .... G01R 31/36; G01R 31/382; G01R 31/385; G01R 31/396
(Continued)

(56) References Cited

U.S. PATENT DOCUMENTS 3,350,574 A * 10/1967 James .................. H03K 3/315
                                                                    324/120
4,999,576 A *  3/1991 Levinson ........... G01R 31/3648
                                                                    324/142
(Continued)

FOREIGN PATENT DOCUMENTS

CN       1421975       6/2003
CN       102116844     7/2011
(Continued)

OTHER PUBLICATIONS

International Preliminary Report on Patentability dated Mar. 23, 2017 in corresponding International Patent Application No. PCT/JP2015/074666.
(Continued)

*Primary Examiner* — Tung X Nguyen
*Assistant Examiner* — Robert P Alejnikov, Jr.

(57) ABSTRACT

A battery checker is provided with: voltage application unit configured to apply an AC voltage to a battery to be measured; ripple voltage measurement unit configured to measure a ripple voltage contained in a terminal voltage of the battery; and electric power storage level detection unit configured to detect an electric power storage level of the battery by comparing the measured ripple voltage with a set reference. The voltage application unit includes a transformer that transforms voltage for an alternating current of an AC power supply such as a commercial AC power supply, and an output circuit that applies, to the battery, an alternating current with transformed voltage.

4 Claims, 1 Drawing Sheet

(51) Int. Cl.
  H01M 10/44 (2006.01)
  H01M 10/48 (2006.01)
  H02J 7/00 (2006.01)
  H01M 10/46 (2006.01)
  H01M 10/42 (2006.01)

(52) U.S. Cl.
  CPC ........... H01M 10/44 (2013.01); H01M 10/46 (2013.01); H01M 10/48 (2013.01); H02J 7/00 (2013.01); H02J 7/0029 (2013.01); H02J 7/0047 (2013.01); *H01M 2220/20* (2013.01); *H01M 2220/30* (2013.01); *H02J 2007/0037* (2013.01); *H02J 2007/0049* (2013.01)

(58) Field of Classification Search
  USPC .................................................. 324/433, 430
  See application file for complete search history.

(56) References Cited

U.S. PATENT DOCUMENTS

| | | | |
|---|---|---|---|
| 5,126,649 A | | 6/1992 | Osanai |
| 5,751,217 A | * | 5/1998 | Kchao .................. G01R 31/392 340/636.16 |
| 6,134,391 A | * | 10/2000 | Takahashi ................ G03B 7/26 320/106 |
| 8,421,416 B2 | * | 4/2013 | Hsu ....................... H02J 7/0072 320/132 |
| 2003/0001579 A1 | * | 1/2003 | Bertness .............. G01R 31/007 324/426 |
| 2008/0284444 A1 | * | 11/2008 | Li ........................ G01R 31/389 324/430 |
| 2009/0140744 A1 | * | 6/2009 | Iwane .................. G01R 31/392 324/430 |
| 2009/0243621 A1 | * | 10/2009 | Kudo ................. G01R 19/0084 324/426 |
| 2011/0133744 A1 | * | 6/2011 | Ono ..................... H01M 10/44 324/430 |
| 2013/0069660 A1 | | 3/2013 | Bernard et al. |
| 2014/0172334 A1 | * | 6/2014 | Cappuccino ......... G01R 31/385 702/63 |
| 2017/0184677 A1 | | 6/2017 | Noda et al. |

FOREIGN PATENT DOCUMENTS

| | | | |
|---|---|---|---|
| CN | 203643582 | 6/2014 | |
| JP | 6-82839 | 11/1994 | |
| JP | 09-288155 | * 4/1997 | ............. G01R 31/36 |
| JP | 9-288155 | 11/1997 | |
| JP | 10-170615 | 6/1998 | |
| JP | 2000-81469 | 3/2000 | |
| JP | 3379298 | 2/2003 | |
| JP | 2004-38029 | 2/2004 | |
| JP | 2005-520158 | 7/2005 | |
| JP | 3675009 | 7/2005 | |
| JP | 2013-142649 | 7/2013 | |
| WO | WO 03/079032 A1 | 9/2003 | |
| WO | WO 2016/039204 A1 | 3/2016 | |

OTHER PUBLICATIONS

Office Action dated Jul. 3, 2018 in corresponding Japanese Patent Application No. 2014-186347, 5 pgs.
Chinese Office Action dated Oct. 8, 2018 in corresponding Chinese Patent Application No. 201580048502.4.
"Battery Tester/Internal Resistance Measuring Instrument Using AC Four-Terminal Method", IW7807-BP, (Datasheet and manual, Rev. 1.7.1, Feb. 16, 2015, Tokyo Devices), pp. 1-4, (https://tokyodevices.jp/system/attachments/files/000/000/298/original/IW7807-BP-F_MANUAL.pdf).
International Search Report dated Nov. 10, 2015 in corresponding International Application No. PCT/JP2015/074666.
Extended European Search Report dated Apr. 12, 2018, in corresponding European Patent Application No. 15839194.6, 7 pgs.
Decision of Refusal dated Jan. 8, 2019 in corresponding Japanese Patent Application No. 2014-186347, 6 pages.
"Battery Tester/Internal Resistance Measuring Instrument Using AC Four-Terminal Method", IW7807-BP, (Datasheet and manual, Rev. 1.7.1, Feb. 16, 2015, Tokyo Devices), pp. 1-4, (http://tokyodevices.jp/system/attachments/files/000/000/298/original/IW7807-BP-F_MANUAL.pdf).

* cited by examiner

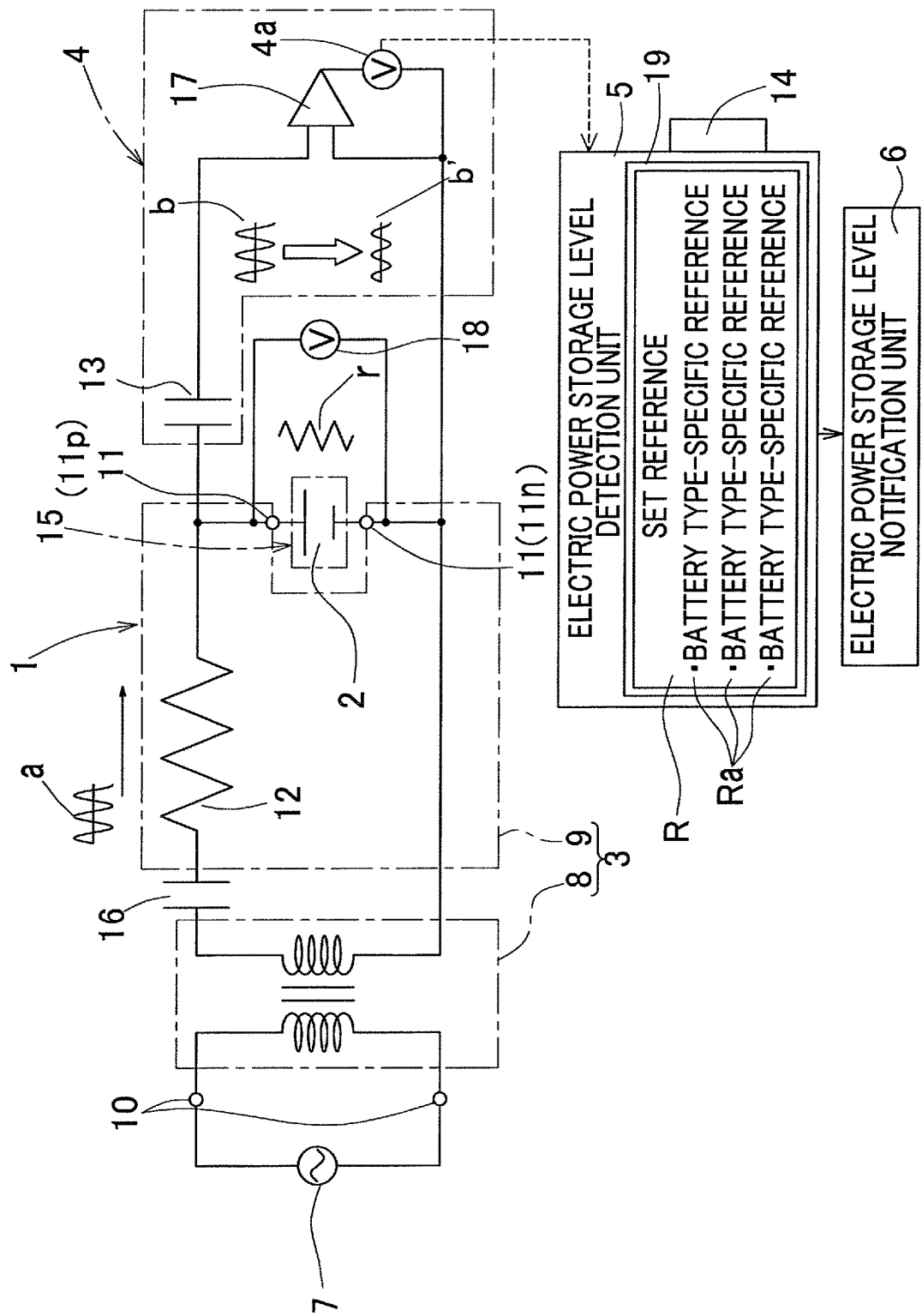

BATTERY CHECKER

CROSS REFERENCE TO THE RELATED APPLICATION

This application is a continuation application, under 35 U.S.C. § 111(a), of international application No. PCT/JP2015/074666, filed Aug. 31, 2015, which is based on and claims Convention priority to Japanese patent application No. 2014-186347, filed Sep. 12, 2014, the entire disclosure of which is herein incorporated by reference as a part of this application.

BACKGROUND OF THE INVENTION

Field of the Invention

The present invention relates to a battery checker that detects an electric power storage level such as a fully charged state during charging of a rechargeable battery and remaining power of the battery in various devices, each having the rechargeable battery, such as an electric vehicle, a smart phone, a 15 rechargeable dry battery, and a Do-It-Yourself (DIY) electric tool.

Description of Related Art

Conventionally, a rectified and smoothed DC power has been used to charge a battery, and an electric power storage state such as a fully charged state of the battery has been checked by detecting the terminal voltage of the battery (e.g., see Patent Documents 1 and 2). As a device that is designed for research and experimental applications for measuring a very low resistance value such as an internal resistance of a battery, a battery tester or internal resistance measuring instrument that uses an AC four-terminal method is commercially available (Non-Patent Document 1).

RELATED DOCUMENT

Patent Document

[Patent Document 1] JP Laid-open Patent Publication No. 2004-38029
[Patent Document 2] JP Laid-open Patent Publication No. H10-170615

Non-Patent Document

[Non-Patent Document 1] Battery tester/internal resistance measuring instrument using AC four-terminal method, IW7807-BP (Datasheet and manual, Rev.1.7.1, Feb. 16, 2015, Tokyo Devices), (https://tokyodevices.jp/system/attachments/files/000/000/298/original/IW7807-BP-F_MANUAL.pdf)

With the conventional methods for checking the electric power storage state from the terminal voltage of the battery, it is difficult to know an accurate electric power storage state. Accordingly, overcharge occurs especially during quick charging, and a problem may arise that a battery lifespan is shortened. Therefore, the inventors of the present invention have paid attention to a proportional relationship between the internal resistance and the electric power storage level of a battery, and considered detecting the electric power storage level by detecting the internal resistance. The internal resistance of the battery can be detected with high precision by using the internal resistance measuring instrument.

However, the conventional internal resistance measuring instruments are devices intended for research and experimental applications and are expensive, and it is difficult to use the instruments for general purposes. Moreover, a measured value varies due to, for example, a resistance value being varied depending on how the terminal is placed, and it is therefore difficult for ordinary people to perform accurate measurement with the instruments.

SUMMARY OF THE INVENTION

The present invention is made to solve the above-described problem, and an object of the invention is to provide a battery checker that can detect an electric power storage level of a battery with high precision and prevent overcharge during charging with a simple configuration.

A battery checker according to the present invention includes: a voltage application unit configured to apply or input an AC voltage to a battery to be measured; a ripple voltage measurement unit configured to measure a ripple voltage contained in a terminal voltage of the battery; and an electric power storage level detection unit configured to detect an electric power storage level of the battery by comparing the ripple voltage measured by the ripple voltage measurement unit with a set reference. The ripple voltage measurement unit may be connected between output terminals, which are connected to the battery, of the voltage application unit.

As used herein, "ripple voltage" refers to a voltage that is superimposed on a direct current component, having periodical fluctuation.

Attention is paid to the proportional relationship between the internal resistance and the charged state of the battery, and the battery checker having this configuration is configured to detect the electric power storage level by measuring the internal resistance, and to apply a voltage for measurement in the AC state so as to allow the internal resistance to be accurately measured with ease. The application of the AC voltage causes generation of a ripple voltage in a terminal voltage of the battery. The fluctuating range, that is, the amplitude of the ripple voltage is proportional to the internal resistance of the battery. In addition, the internal resistance of the battery decreases as charging progresses. Accordingly, the fluctuating range of the terminal voltage of the battery is measured by the ripple voltage measurement unit and the detected ripple voltage is compared with the set reference by the electric power storage level detection unit, whereby the electric power storage level of the battery can be accurately detected.

Although the set reference is a reference that is generated as appropriate for determining an electric power storage level that can be known or obtained from the relationship between the ripple voltage and the internal resistance, it may be a reference directly representing the relationship between the ripple voltage and the electric power storage level, without particularly representing the internal resistance as a resistance value. The set reference may be represented as a curve that indicates the relationship between the ripple voltage and the electric power storage level, or may simply be a value representing a predetermined electric power storage state such as a fully charged state as a fixed threshold value of the ripple voltage.

Since the electric power storage level of the battery can be accurately detected in this manner, a fully charged state during charging can be detected with high precision, and overcharge during quick charging or the like can be avoided, thereby preventing reduction in the lifespan of the battery.

Furthermore, the above-described accurate detection of the electric power storage level can be performed with a simple configuration merely including the voltage application unit configured to apply an alternating current, and the ripple voltage measurement unit and the electric power storage level detection unit that have the above-described configurations.

In the battery checker according to an embodiment of the present invention, the voltage application unit may include a transformer configured to transform a voltage of an AC power supply to a voltage suitable for a voltage of the battery, and an output circuit configured to apply, to the battery, the AC voltage transformed by the transformer.

In the case of this configuration, by using an AC 100V commercial power supply or the like for general household use or the like as the AC power supply, the voltage application unit can have a simple configuration merely including a transformer and a circuit that simply outputs the AC voltage transformed by the transformer.

In the battery checker according to an embodiment of the present invention, the electric power storage level detection unit may include a reference storage unit configured to store, as the set reference, a plurality of battery type-specific references corresponding to types of the battery to be detected or measured, and a reference switching unit configured to switch between the plurality of battery type-specific references.

The relationship between the ripple voltage and the internal resistance differs, for example, according to the types of the battery such as a lead battery, a manganese battery, and a lithium ion battery, or according to the voltage varying with the number of stacked cells in the battery. Therefore, by setting the plurality of battery type-specific references and providing the reference switching unit, application to various batteries is possible. The reference switching unit may switch the reference for each use. Alternatively, the reference switching unit may switch the reference once, and thereafter use one battery type-specific reference as a fixed reference, so that the battery checker may be used as a battery checker dedicated to a predetermined battery.

In the battery checker according to an embodiment of the present invention, the ripple voltage measurement unit may include a capacitor connected to an output terminal on a positive electrode side of the battery, an amplifier configured to amplify a voltage between the capacitor and a terminal on a negative electrode side of the battery, and a voltmeter configured to measure a ripple voltage amplified by the amplifier. Since the capacitor is interposed between the battery and the amplifier, a DC voltage of the battery is not applied to the amplifier, and only a ripple voltage of the battery is applied to the amplifier, thereby making it possible to measure the ripple voltage with high precision.

Any combination of at least two constructions, disclosed in the appended claims and/or the specification and/or the accompanying drawings should be construed as included within the scope of the present invention. In particular, any combination of two or more of the appended claims should be equally construed as included within the scope of the present invention.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

FIG. 1 is an explanatory diagram showing a circuit configuration of a battery checker according to an embodiment of the present invention by using an electric circuit and blocks.

DESCRIPTION OF EMBODIMENTS

An embodiment of the present invention will be described in conjunction with the drawings. A battery checker 1 of the present embodiment includes a voltage application unit 3 configured to apply an AC voltage to a battery 2 to be measured, a ripple voltage measurement unit 4 configured to measure a ripple voltage contained in a terminal voltage of the battery 2, and an electric power storage level detection unit 5 configured to detect an electric power storage level of the battery 2 by comparing the ripple voltage measured by the ripple voltage measurement unit 4 with a set reference R. In addition to these, the battery checker 1 includes an electric power storage level notification unit 6 configured to make notification of the electric power storage level detected by the electric power storage level detection unit 5. Although the battery 2 is mounted in a battery mounting device 15, it may be in a stand-alone state. The battery mounting device 15 may be any device that has a rechargeable battery 2. Examples thereof include a charging socket for a rechargeable dry battery, an electric vehicle, a smart phone, a personal computer, and a DIY electric tool.

The voltage application unit 3 includes a transformer 8 that transforms a voltage of an AC power supply 7 to a voltage suitable for checking a voltage of the battery 2, and an output circuit 9 that applies or inputs, to the battery 2, the AC voltage transformed by the transformer 8. Although the voltage suitable for checking the voltage of the battery 2 differs depending on the capacity of the battery 2, it may be a voltage that is higher than the voltage of the fully charged battery 2 by several volts (2 to 3 V) or more, for example. The AC power supply 7 is, for example, a single-phase 100V or 200V AC commercial power supply. Input terminals 10 such as a plug that is inserted into an outlet (not shown) in the wiring of the AC power supply 7 are provided to an upstream of the transformer 8.

The output circuit 9 may be configured to output to output terminals 11 which apply, to the battery 2 or the battery mounting device 15, the AC voltage transformed by the transformer 8. In the illustrated example, a current limiting resistor 12 and a capacitor 16 for preventing the passage of the DC voltage of the battery 2 are provided between the output terminals 11, 11 and a secondary coil of the transformer 8 in the output circuit 9. In order to set the ripple current value corresponding to the battery 2, the current limiting resistor 12 can be replaced with a resistor having a different resistance value.

The ripple voltage measurement unit 4 includes an amplifier 17 that includes an operational amplifier or the like, a capacitor 13, and a voltmeter 4a.

The amplifier 17 is an amplifier that amplifies the voltage between two differential input terminals. The output terminal 11 (11p) on the positive electrode side of the battery 2 is connected, via the capacitor 13, to an input terminal of the amplifier 17 on the positive electrode side, and the output terminal 11 (11n) on the negative electrode side of the battery 2 is directly connected to an input terminal of the amplifier 17 on the negative electrode side. Since the capacitor 13 is interposed between the battery 2 and the amplifier 17, the DC voltage of the battery 2 is not applied to the amplifier 17, and only the ripple voltage of the battery 2 is applied to the amplifier 17. The ripple voltage amplified by the amplifier 17 in this manner is measured by the voltmeter 4*a*. The voltage between the output terminals 11, 11 of the battery 2 is measured by another voltmeter 18 connected between the output terminals 11.

The electric power storage level detection unit 5 includes a reference storage unit 19 configured to store, as the set reference R, a plurality of battery type-specific references Ra corresponding to respective types of the battery 2 to be measured, and a reference switching unit 14 configured to switch between the plurality of battery type-specific references Ra. The reference storage unit 19 includes an electronic circuit, a microcomputer, or the like that includes a storage device having the set reference R stored therein. The reference switching unit 14 includes, for example, an operation device operated by an operator, and a circuit, a program, or the like (each of which is not shown) configured to switch between the battery type-specific references Ra in response to the operation of the operator.

Although the set reference R is a reference that is generated as appropriate for indicating an electric power storage level that can be known or obtained from the relationship between the ripple voltage and the internal resistance, it may be a reference directly representing the relationship between the ripple voltage and the electric power storage level, without particularly representing the internal resistance as a resistance value. The set reference R may be represented as a curve that indicates the relationship between the ripple voltage and the electric power storage level, or may simply be a value representing a fully charged state as a certain threshold value of the ripple voltage.

The plurality of battery type-specific references Ra in the set reference R are set, for example, according to the type of battery such as a lead battery, a manganese battery, or a lithium ion battery, according to the voltage varying with the number of stacked cells in the battery 2, or according to both of these. The reference switching unit 14 may switch the reference for each use. Alternatively, the reference switching unit 14 may switch the reference once, and thereafter use one battery type-specific reference as a fixed reference, so that the battery checker may be used as a battery checker dedicated to a predetermined battery.

The electric power storage level notification unit 6 is a unit configured to notify a person or a device of information representing the electric power storage level detected by the electric power storage level detection unit 5, and includes an image display device having a liquid crystal screen that indicates the electric power storage level as an image such as a bar chart, or one or a plurality of lamps that are controlled such that, according to the electric power storage level, the number of lamps that are lit up is changed, or the lamps are switched between a lit-up state, a blinking state, and the like. The electric power storage level notification unit 6 may have a function of stopping a charge performed by a charger device (not shown) when the electric power storage level is a fully charged state.

According to the battery checker 1 having this configuration, an alternating current is applied to the battery 2, so that a ripple voltage is generated in the terminal voltage of the battery 2. That is, the application of an alternating current a shown in FIG. 1 to the battery 2 causes generation of a ripple voltage b having a waveform shown in FIG. 1. The fluctuating range, that is, the amplitude of the ripple voltage is proportional to an internal resistance r of the battery 2. The internal resistance r of the battery 2 decreases as charging progresses. Accordingly, as charging progresses, the ripple voltage b decreases as indicated by a waveform denoted by reference character "b'".

Accordingly, the fluctuating range of the terminal voltage of the battery 2 is measured by the ripple voltage measurement unit 4 and the detected ripple voltage is compared with the set reference by the electric power storage level detection unit 5, whereby the electric power storage level of the battery 2 can be accurately detected.

Since the electric power storage level of the battery 2 can be accurately detected in this manner, a fully charged state during charging can be detected with high precision, and overcharge during quick charging or the like can be avoided, thereby preventing reduction in the lifespan of the battery 2. Furthermore, the above-described accurate detection of the electric power storage level can be performed with a simple configuration merely including the voltage application unit 3 configured to apply the alternating current, and the ripple voltage measurement unit 4 and the electric power storage level detection unit 5 that have the above-described configurations.

Since the voltage application unit 3 in this example includes the transformer 8 that transforms the voltage of the AC power supply 7 and the output circuit 9 that applies, to the battery 2, the voltage transformed by the transformer 8, an AC 100V commercial power supply or the like for general household use or the like can be used as the AC power supply 7. Therefore, the voltage application unit 3 is allowed to have a simple configuration.

The electric power storage level detection unit 5 includes the plurality of battery type-specific references Ra corresponding to the respective types of the battery 2 to be detected and the reference switching unit 14 for switching between the plurality of the battery type-specific references Ra, so that application to various types of the battery 2 is possible.

Although the present invention has been fully described in connection with the preferred embodiments thereof with reference to the accompanying drawings, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

REFERENCE NUMERALS

1 . . . battery checker
2 . . . battery
3 . . . voltage application unit
4 . . . ripple voltage measurement unit
4*a* . . . voltmeter
5 . . . electric power storage level detection unit
6 . . . electric power storage level notification unit
7 . . . AC power supply
8 . . . transformer
9 . . . output circuit
11*p* . . . output terminal on positive electrode side of battery
11*n* . . . output terminal on negative electrode side of battery
15 . . . battery mounting device
19 . . . reference storage unit
R . . . set reference
Ra . . . battery type-specific reference

What is claimed is:

1. A battery checker comprising:
a voltage application unit configured to apply an AC voltage to a battery to be measured;
a ripple voltage measurement unit configured to measure a ripple voltage contained in a terminal voltage of the battery, the ripple voltage measurement unit including a capacitor connected to an output terminal on a positive electrode side of the battery, and an amplifier directly connected to an output terminal on a negative electrode side of the battery; and
an electric power storage level detection unit configured to detect an electric power storage level of the battery by comparing the ripple voltage measured by the ripple voltage measurement unit with a set reference.

2. The battery checker as claimed in claim 1, wherein the voltage application unit includes a transformer configured to transform a voltage of an AC power supply to a voltage suitable for a voltage of the battery, and an output circuit configured to apply, to the battery, the AC voltage transformed by the transformer.

3. The battery checker as claimed in claim 1, wherein the electric power storage level detection unit includes a reference storage unit configured to store, as the set reference, a plurality of battery type-specific references corresponding to types of the battery to be measured, and a reference switching unit configured to switch between the plurality of battery type-specific references.

4. The battery checker as claimed in claim 1, wherein the amplifier is configured to amplify a voltage between the capacitor and the output terminal on a negative electrode side of the battery, and the ripple voltage measurement unit further includes a voltmeter configured to measure a ripple voltage amplified by the amplifier.

* * * * *